(12) United States Patent
Ivry

(10) Patent No.: US 6,895,546 B2
(45) Date of Patent: May 17, 2005

(54) SYSTEM AND METHOD FOR ENCODING AND DECODING DATA UTILIZING MODIFIED REED-SOLOMON CODES

(75) Inventor: Raanan Ivry, Haifa (IL)

(73) Assignee: Broad-Light Ltd., Ramat Gan (IL)

( * ) Notice: Subject to any disclaimer, the term of this patent is extended or adjusted under 35 U.S.C. 154(b) by 433 days.

(21) Appl. No.: 10/219,546

(22) Filed: Aug. 16, 2002

(65) Prior Publication Data

US 2003/0070134 A1 Apr. 10, 2003

Related U.S. Application Data

(60) Provisional application No. 60/312,350, filed on Aug. 16, 2001, and provisional application No. 60/331,051, filed on Nov. 7, 2001.

(51) Int. Cl.$^7$ ..................... H03M 13/15; H03M 13/29
(52) U.S. Cl. ......................... 714/784; 714/755
(58) Field of Search .................. 714/784, 755

(56) References Cited

U.S. PATENT DOCUMENTS

| | | | |
|---|---|---|---|
| 4,856,003 A | * | 8/1989 | Weng .......................... 714/784 |
| 5,428,627 A | * | 6/1995 | Gupta ......................... 714/771 |
| 5,428,630 A | * | 6/1995 | Weng et al. ................. 714/763 |
| 5,822,336 A | * | 10/1998 | Weng et al. ................. 714/784 |

OTHER PUBLICATIONS

Irving S. Reed, et al., "Polynomial Codes Over Certain Finite Fields", J. Soc. Indust. Appl. Math., V 1. 8, N 2, pp. 300–304, Jun. 1960.

* cited by examiner

*Primary Examiner*—Stephen M. Baker
(74) *Attorney, Agent, or Firm*—Jerold I. Schneider; Dla Piper Rudnick; Gray Cary US LLP

(57) ABSTRACT

A system and method for coding technique which achieves a high coding gain with simple, low-price implementation. The system comprises a transmitter for transmitting encoded code words, and a receiver for receiving and decoding the code words, via a network. In one embodiment, a low complexity modified R-S coding process is used to R-S encode smaller-bit words (e.g., 7-bit words, instead of 8-bit words). In a second embodiment, a feed-back block concatenated coding process improves coding gain by utilizing concatenation and an erasure algorithm. In a third embodiment, a feed-back block concatenated coding process is designed for an Ethernet. The decoding processes utilize error-correcting capabilities built in during the three encoding processes described herein.

14 Claims, 13 Drawing Sheets

FIGURE 5

8-BIT to 7-BIT TRANSFORMATION EXAMPLE

| WORD | 8-BIT DATA | 7-BIT DATA |
|---|---|---|
| 1 | 00001111 | 0001111 |
| 2 | 10001111 | 1110000 |
| 3 | 11111111 | 0000000 |
| 4 | 00000000 | 0000000 |
| 5 | | |
| 6 | | |
| 7 | | |
| ... | | |
| 118 | | |
| 119 | | |
| 120 | | |
| 121 | | |

FIGURE 10

7-BIT to 8-BIT
TRANSFORMATION EXAMPLE

| WORD | 8-BIT ORIGINAL DATA | 7-BIT DATA RECEIVED DATA | 8-BIT CORRECTED DATA |
|---|---|---|---|
| 1 | 00010000 | 00000000 | 00000000 |
| 2 | 11010110 | 0000000 | 11111111 |
| 3 | 10111111 | 1110000 | 10001111 |
| 4 | 00100111 | 0001111 | 00001111 |
| 5 | | | |
| 6 | | . | |
| 7 | | | |
| ... | | | |
| 118 | | | |
| 119 | | | |
| 120 | | | |
| 121 | | | |

SYSTEM AND METHOD FOR ENCODING AND DECODING DATA UTILIZING MODIFIED REED-SOLOMON CODES

This application claims priority from U.S. Provisional Application Ser. No. 60/312,350 filed Aug. 16, 2001, and U.S. Provisional Application Ser. No. 60/331,051 filed Nov. 7, 2001. The entirety of those provisional applications are incorporated herein by reference.

BACKGROUND OF THE INVENTION

1. Field of the Invention

The present invention generally relates to a system and method for transmitting information, and more specifically, to a system and method for transmitting information using modified Reed-Solomon coding.

2. Related Art

High-speed communication, such as fiber-optic communication, has become increasingly advanced. Techniques have been developed to send a high capacity (bit rate) message accurately, in the presence of transmission noise, over a long distance.

In high-speed communications, messages are encoded into binary tuples, yielding defined code words. These code words are often transmitted erroneously (e.g., due to transmission noise).

Errors can be detected and corrected using error-correction coding (ECC). Error-correction coding (ECC) is used to control errors by coding extra (redundant) bits into a stream of data transmitted to a receiving device. The redundant bits are used by the receiving device in detecting and, where possible, correcting errors in the data.

The ability to detect or correct errors depends on the known set of defined code words. The number of bits by which any two code words differ determines the error-detecting capability of a code. If any two code words are separated by at least n-bits, then if a received code word is separated from another code word by less than n-bits, errors can be detected as no such code words are defined. If the number of errors is less than n/2 the error can be corrected. For example, suppose a minimum distance for a code is 2, and a system is defined with only 2 code words: the letter B=1001 and the letter C=1111. B and C differ from each other by 2 bits. If the received word is 1101, it is known to be an error because 1101 is not defined as a code word, and will yield an error indication. Most ECCs are characterized by the maximum number of errors they can detect and by the maximum number of errors they can correct.

One important ECC coding technique is Reed-Solomon (R-S) coding. R-S was devised to address the issue of correcting multiple errors in transmitted data. The number and type of errors that can be detected and corrected depend on the specific R-S coding scheme used. An R-S code is specified as RS (s,j) with n-bit words, where s is $2^{n-1}-1$, and j is the number of data words. The number of redundancy, or parity, words, is equal to s−j (always an even number). An R-S system can correct up to t number of bytes, where t=(s−j)/2. Those skilled in the relevant arts will be familiar with R-S coding systems and methods. For additional information, the following source is incorporated by reference: Irving S. Reed and Gustave Solomon, "Polynomial Codes over Certain Finite Fields," Journal of the Society for Industrial and Applied Mathematics, Vol. 8, 300–304 (1960).

Current ECC techniques are not practical. ECC techniques used in high speed digital communication are complex and expensive. There is thus a need for new coding techniques which provide a high coding gain (i.e., higher bit rates over longer distances) and simple, low-cost implementation.

SUMMARY OF THE INVENTION

The present invention provides a technique for coding data for transmission over high-speed networks which achieves a high coding gain with simple, low-cost implementation.

The system of the present invention includes a transmitter for transmitting data (e.g., code words) and a receiver for receiving data, via a network. The transmitter utilizes an encoder before transmitting the data. The receiver utilizes a decoder to interpret the received data and detect and correct errors in the data.

The present invention includes at least two embodiments. In the first embodiment, the modified R-S coding is a low complexity modified R-S coding. In the second embodiment, the modified R-S coding is a feed-back block concatenated coding. In an additional embodiment, the feed-back block concatenated coding is designed for use with the Ethernet.

The low complexity modified Reed-Solomon (R-S) coding process transforms a stream of n-bit words into (n−1)-bit words, encodes these words using a R-S encoder, transmits the words, decodes the words, and then transforms the (n−1)-bit words back into the original n-bit words. R-S encoding a smaller word of (n−1)-bits is less expensive to implement than R-S encoding an n-bit word. First, an original $(2^{n-1}-1-2t)$ number of n-bit words are transformed into $(2^{n-1}-2t)$ (n−1)-bit words. The $(2^{n-1}-1-2t)$ (n−1)-bit words are then encoded with a R-S encoder to obtain $(2^{n-1}-1-2t)$ (n−1)-bit words and 2t (n−1)-bit redundancy words. The 2t (n−1)-bit redundancy words and the original $(2^{n-1}-1-2t)$ n-bit words are transmitted to the receiver. The received $(2^{n-1}-1-2t)$ n-bit words and the 2t (n−1)-bit redundancy words are then decoded using a modified R-S decoder to obtain $(2^{n-1}-1-2t)$ n-bit words (i.e., the estimated data n-bit words). The decoding process consists of transforming the $(2^{n-1}-1-2t)$ n-bit words into $(2^{n-1}-1-2t)$ (n-1)-bit words, R-S decoding the $(2^{n-1}-1-2t)$ (n−1)-bit words and 2t (n−1)-bit redundancy words, transforming the $(2^{n-1}-1-2t)$ (n−1)-bit corrected words into $(2^{n-1}-1-2t)$ n-bit words, comparing them with the $(2^{n-1}-1-2t)$ n-bit received words, and correcting them. The decoding process utilizes the error-correcting capability built in during the encoding process.

The feed-back block concatenated coding process combines an R-S coding mechanism with an erasure algorithm. In this process, original $(2^n-1-2t)$ (n+m)-bit words are encoded using a R-S encoder and some logic to obtain $(2^n-1-2t)$ (n+m+k)-bit words and 2t (n+m+k)-bit redundancy words. In this embodiment, n+m is the number of bits in the original data word, n is the symbol length of the R-S encoder and decoder, and k is the number of redundancy bits which enable a minimum Hamming distance between the (m+n+k)-bit code words. The encoding incorporates an error-correcting capability utilized when interpreting the transmitted words. The $(2^n-1-2t)$ (n+m+k)-bit words and the 2t (n+m+k)-bit redundancy words are then transmitted to the receiver. The received $(2^n-1-2t)$ (n+m+k)-bit words and the 2t (n+m+k)-bit redundancy words are then decoded using a modified R-S decoder to obtain $(2^n-1-2t)$ (n+m)-bit words (i.e., the estimated (n+m)-bit data words). The decoding process utilizes the error-correcting capability built in during the encoding process.

The feed-back block concatenated process can be used in an additional embodiment, which is a code design for Ethernet Point to Multi-Point (P2MP) Physical Layer. In this case, the coding scheme is designed to achieve high transition density, direct current (DC) balanced, and special code groups above the ability of a normal error correction code.

Advantages of the present invention include high coding gain and simple, lower-price implementation.

BRIEF DESCRIPTION OF THE FIGURES

Additional features and advantages of the present invention will become more apparent from the detailed description set forth below when taken in conjunction with the drawings in which like reference numbers indicate identical or functionally similar elements.

FIGS. 4–5 are a flowchart and a table illustrating n-bit to (n−1)-bit transformation process 305 of FIG. 3, in accordance with an embodiment of the present invention.

FIGS. 9–10 are a flowchart and a table illustrating the (n−1)-bit to n-bit transformation process 710 of FIG. 7, in accordance with an embodiment of the present invention.

DESCRIPTION OF THE INVENTION

System Overview

Figure 1:
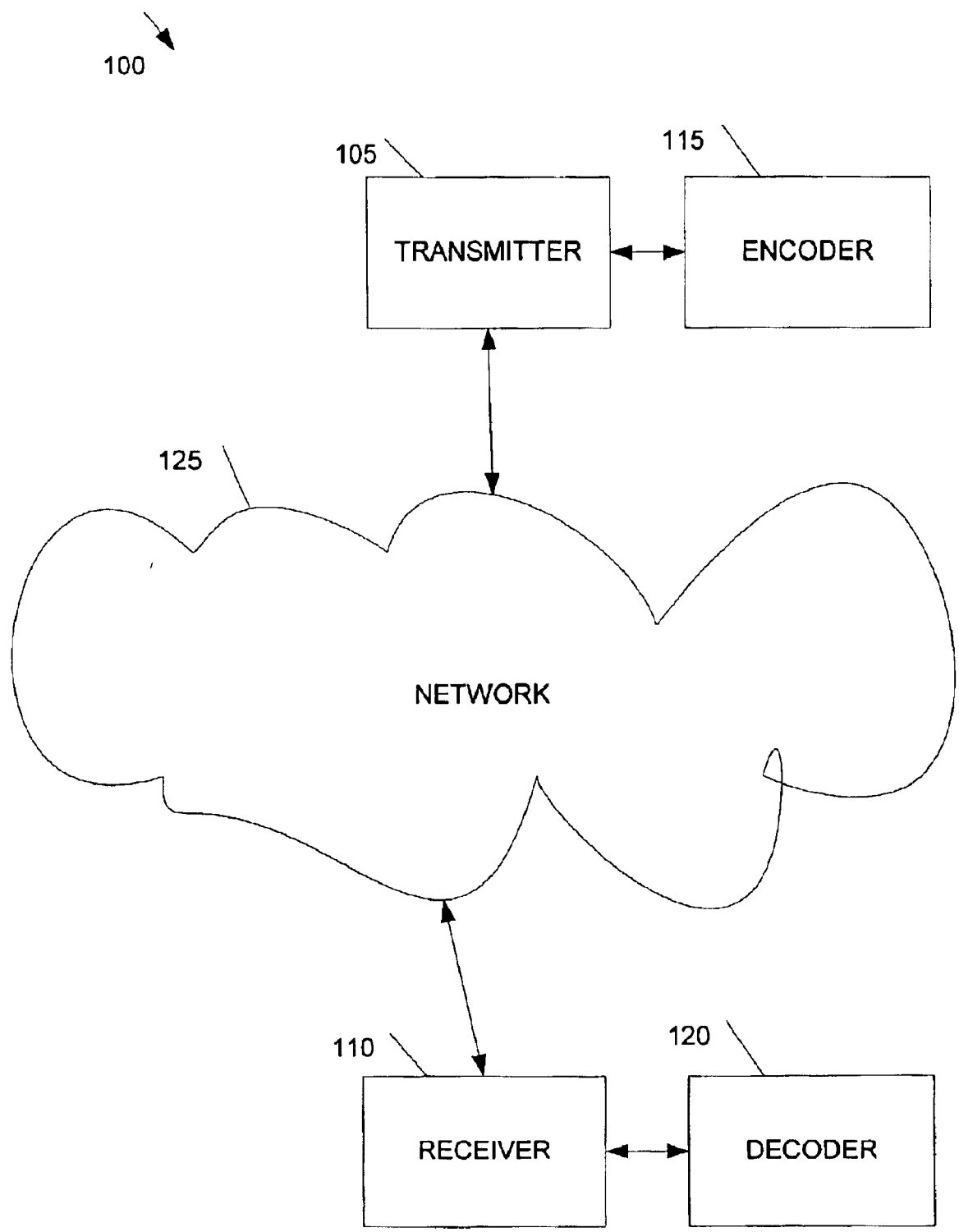
FIG. 1 illustrates a diagram of the coding system, according to an embodiment of the present invention.

FIG. 1 is a block diagram illustrating a coding system, according to an embodiment of the present invention. The system 100 includes a transmitter 105 for transmitting data (e.g., code words) and a receiver 110 for receiving data, via a wide area communication network 125 (e.g., Internet, public switched telephone network). The transmitter 105 utilizes an encoder, 115 (e.g., a low complexity modified R-S encoder, a feed-back block concatenated encoder) before transmitting the data. The receiver 110 utilizes a decoder 120 (e.g, a low complexity modified R-S decoder, a feed-back block concatenated decoder) to interpret the received data.

The present invention includes at least two embodiments. In the first embodiment, the modified R-S coding is a low complexity modified R-S coding. In the second embodiment, the modified R-S coding is a feed-back block concatenated coding. In an additional embodiment, the feed-back block concatenated coding is designed for use with the Ethernet.

Low Complexity Modified Reed-Solomon Coding
Process Overview

Figure 2:
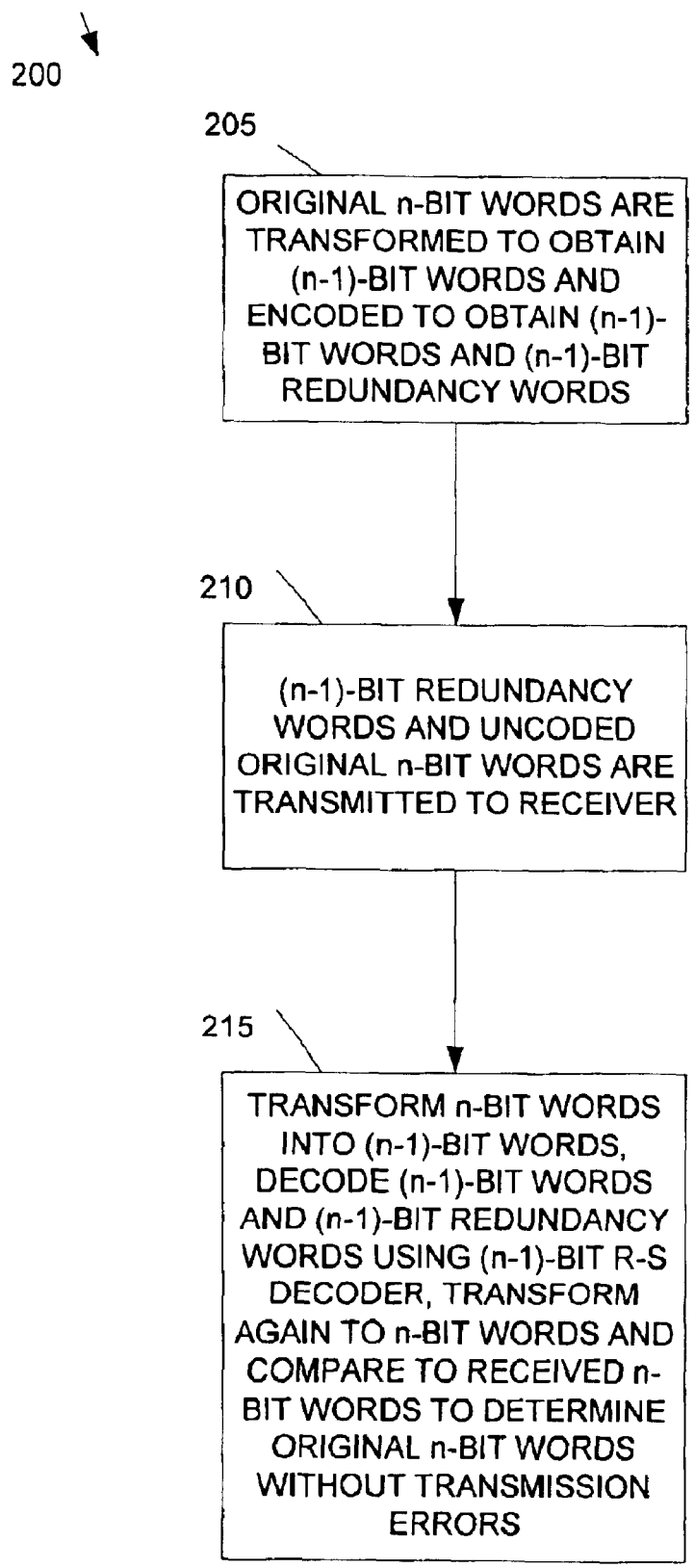
FIG. 2 illustrates an overview of the low complexity modified R-S code process 200, according to an embodiment of the present invention.

FIG. 2 illustrates an overview of the low complexity modified R-S code process 200, according to an embodiment of the present invention.

The low complexity modified R-S coding process transforms a stream of n-bit words into (n−1)-bit words, encodes these words using a R-S encoder, transmits the uncoded data words and the (n−1)-bit redundancy words, R-S decodes the words, and then, with the aid of the received n-bit data words, estimates the received data. R-S encoding a smaller word of (n−1)-bits is more efficient than R-S encoding an n-bit word.

In step 205, the original uncoded $(2^{n-1}-1-2t)$ n-bit code words are encoded using a modified R-S encoder to obtain $(2^{n-1}-1-2t)$ (n−1)-bit words and 2t (n−1)-bit redundancy words. The encoding incorporates an error-correcting capability utilized during later decoding of the transmitted words. Thus, for example, in step 205, if n=8 and t=3, the 121 8-bit words are encoded using a modified R-S encoder to obtain 121 7-bit words and 6 7-bit redundancy words. In step 210, the 2t (n−1) n-bit redundancy words, and the $(2^{n-1}-1-2t)$ n-bit original uncoded words are transmitted to the receiver. Thus, for example, the 6 7-bit redundancy words and the 121 8-bit words are transmitted to the receiver. All words can be transmitted erroneously. The decoding process 215 will discover erroneous data as long as the number of erroneous words is less than 3 and the number of erroneous bits in each word is less than 4. In step 215, the received $(2^{n-1}-1-2t)$ n-bit words and 2t (n−1)-bit redundancy words are decoded using a n-bit to (n−1)-bit transformer and a (n−1)-bit R-S decoder, and compared to the original uncoded data, to obtain $(2^{n-1}-1-2t)$ n-bit estimated words. The decoding process 215 utilizes the error-correcting capability incorporated during encoding process 205. Thus, for example, the data corresponding to the 121 8-bit words and the 6 7-bit redundancy words are decoded to obtain 121 8-bit words that correspond to the original transmitted 121 8-bit words, even if there were errors in the transmission.

Encoder

Figure 3:
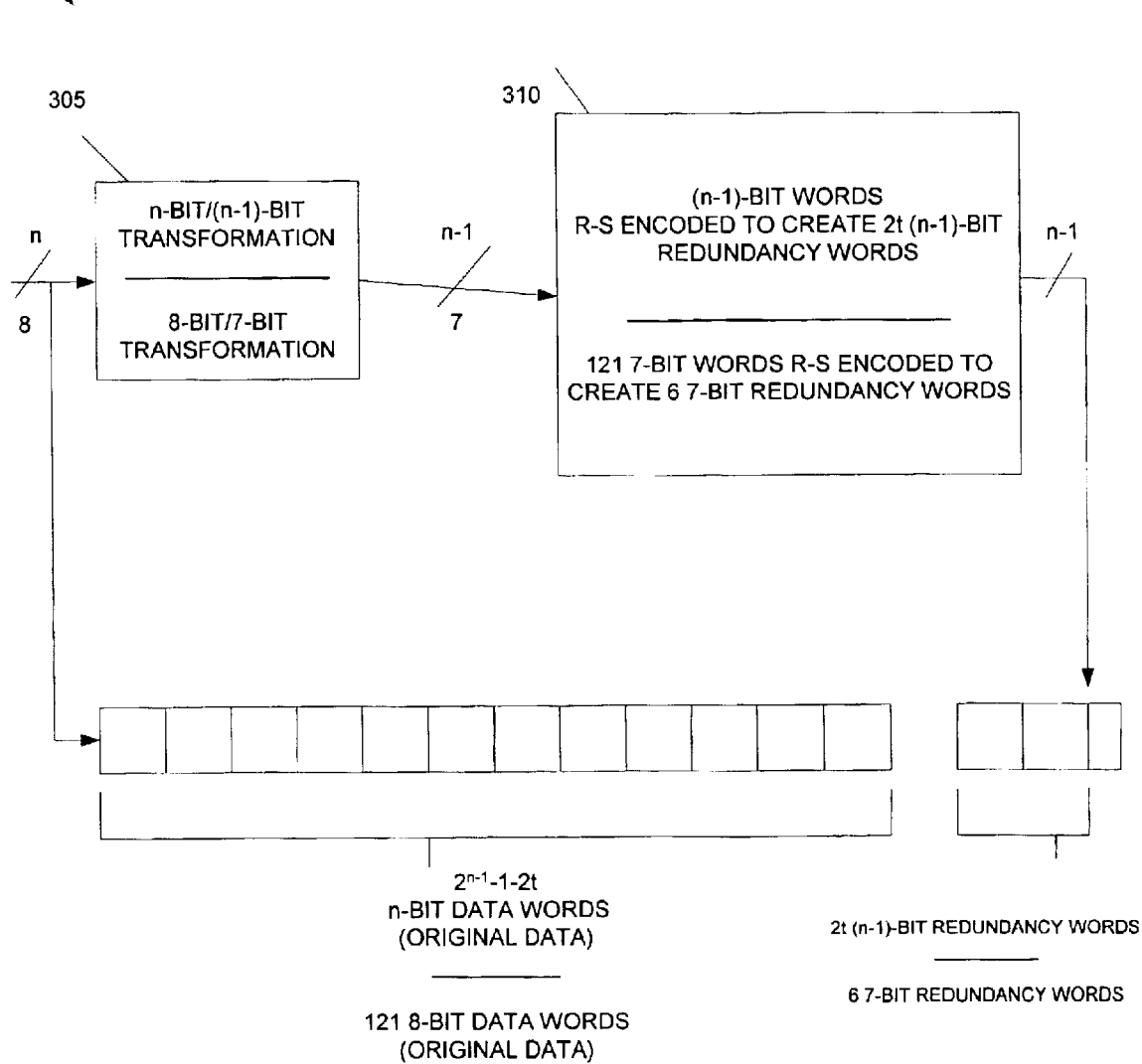
FIG. 3 is a flowchart illustrating low complexity modified R-S encoder transformation process 205 of FIG. 2, in accordance with an embodiment of the present invention.

FIG. 3 is a flowchart illustrating modified R-S encoder transformation process 205 of FIG. 2, in accordance with an embodiment of the present invention.

In step 305, the n-bit words are transformed into (n−1)-bit words. Thus, for example, the 8-bit words are transformed into 7-bit words. In step 310, the (n−1)-bit words are encoded using a R-S encoder to obtain (2t) (n−1)-bit redundancy words. Thus, for example, the 7-bit words are encoded using an R-S encoder to obtain 6 7-bit redundancy words. Great economies of scale are realized when R-S encoding a smaller-bit word, such as a 7-bit word, instead of an 8-bit word.

Figure 4:
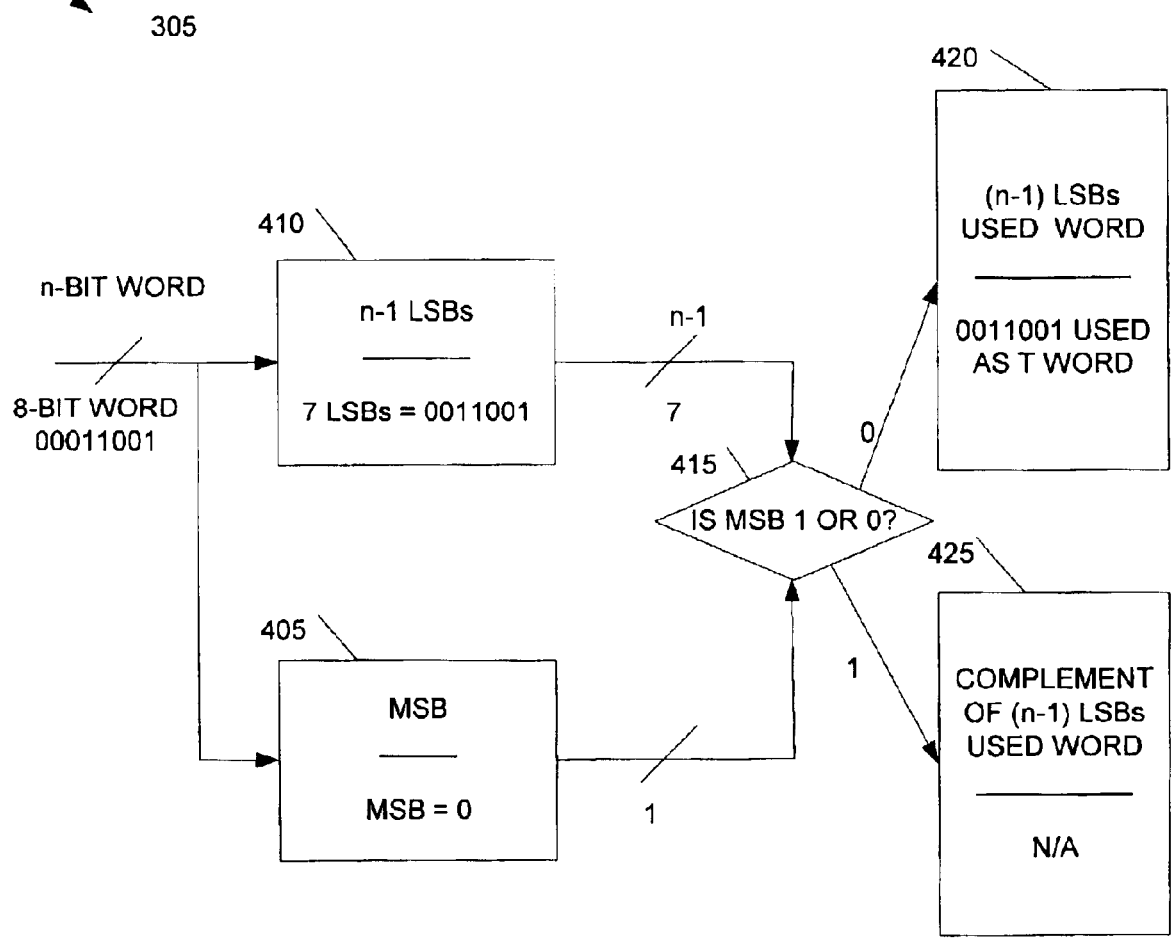

FIGS. 4–5 are a flowchart and table illustrating n-bit to (n−1)-bit transformation process 305 of FIG. 3, in accordance with an embodiment of the present invention.

It should be noted that those skilled in the relevant arts will recognize that this n-bit to (n−1)-bit transformation process is one of many n-bit to (n−1)-bit transformation processes that could be used, and that there are other n-bit to (n−1)-bit transformation processes that could be used as a replacement process.

In step 405, the most significant bit ("MSB") is cut off from the n-bit words. Thus, for example, if the 8-bit word was 00011001, the MSB is 0. In step 410, which occurs in parallel with step 405, the (n−1) least significant bits ("LSBs") of the n-bit words are cut off. Thus, for example, if the 8-bit word is 00011001, 0011001 are the 7 LSBs.

In step 415, it is determined if the MSB is a 1 or 0. If the MSB is a 0, the (n−1) LSBs are used as the (n−1)-bit word in step 420. Otherwise, if the MSB is a 1, the complement of the (n−1) LSBs are used as the (n−1)-bit word in step 425. In the example, the MSB is a 0, so the 7 LSBs 0011001 are used as the 7-bit word. Other examples of process 400 are illustrated in FIG. 5. As shown in entries 3 and 4 of FIG. 5, the n-bit to (n−1)-bit transformation of 2 different complementary words generate the same 7-bit word. This feature will be utilized in decoding process 215 described in more detail below.

Figure 6:
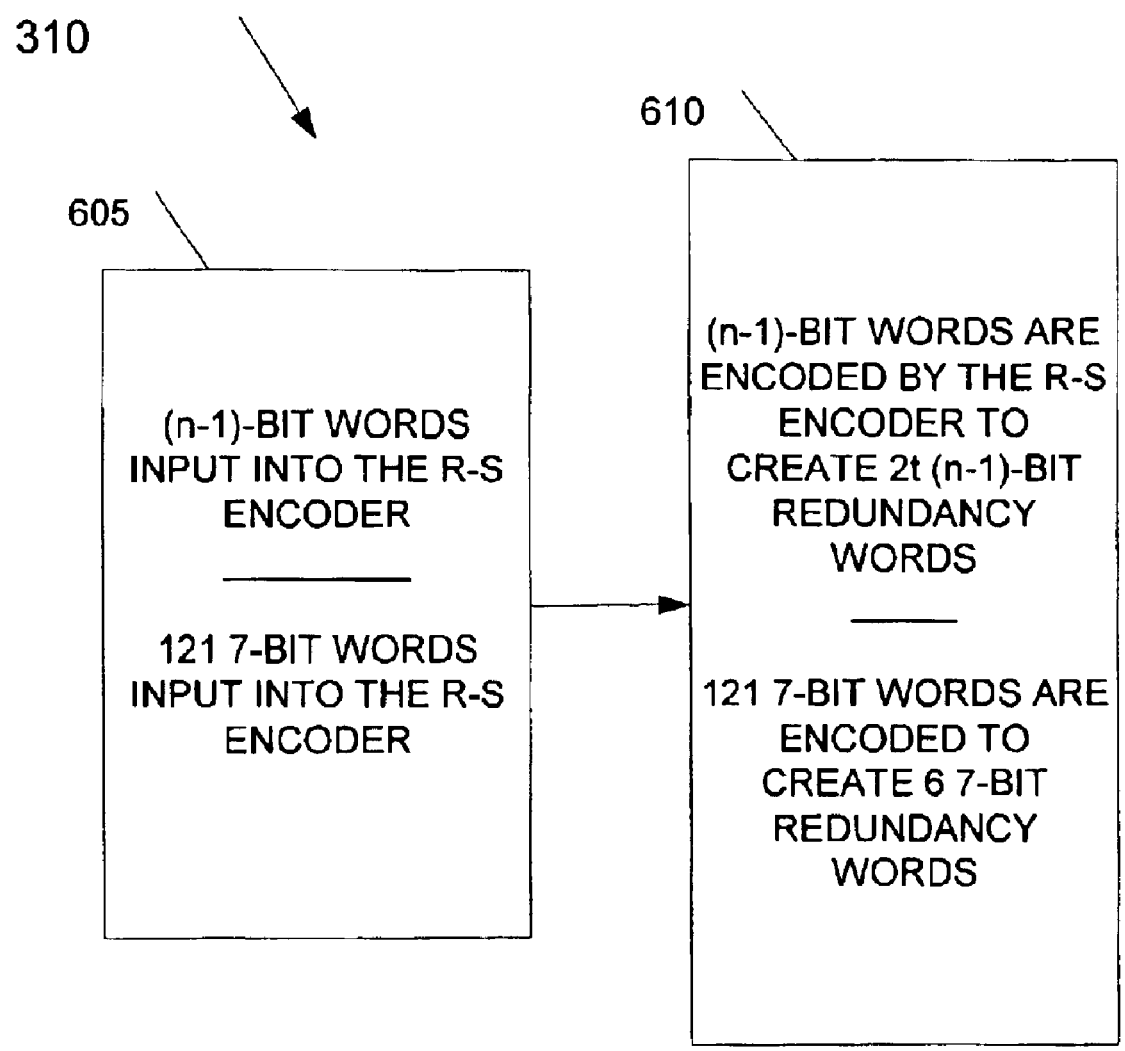
FIG. 6 is a flowchart illustrating R-S process 310 of FIG. 3, in accordance with an embodiment of the present invention.

FIG. 6 is a flowchart illustrating R-S process 310 of FIG. 3, in accordance with an embodiment of the present invention. The following example illustrates one embodiment of an R-S encoder. Those skilled in the relevant arts will be familiar with the R-S encoder, and will realize that other embodiments are possible.

In step 605, the (n−1)-bit words are inputted into an R-S encoder. Thus, in our example, 121 7-bit words are input into the R-S encoder. In step 610, the R-S encoder utilizes the $(2^{n-1}-1-2t)$ (n−1)-bit words to create 2t (n−1)-bit redundancy words. Thus, for example, the 121 7-bit words are input into the R-S encoder to create 6 7-bit redundancy words. For more information regarding process 310, see Irving S. Reed and Gustave Solomon, "Polynomial Codes over Certain Finite Fields," Journal of the Society for Industrial and Applied Mathematics, Vol. 8, 300–304 (1960).

Decoder

Figure 7:
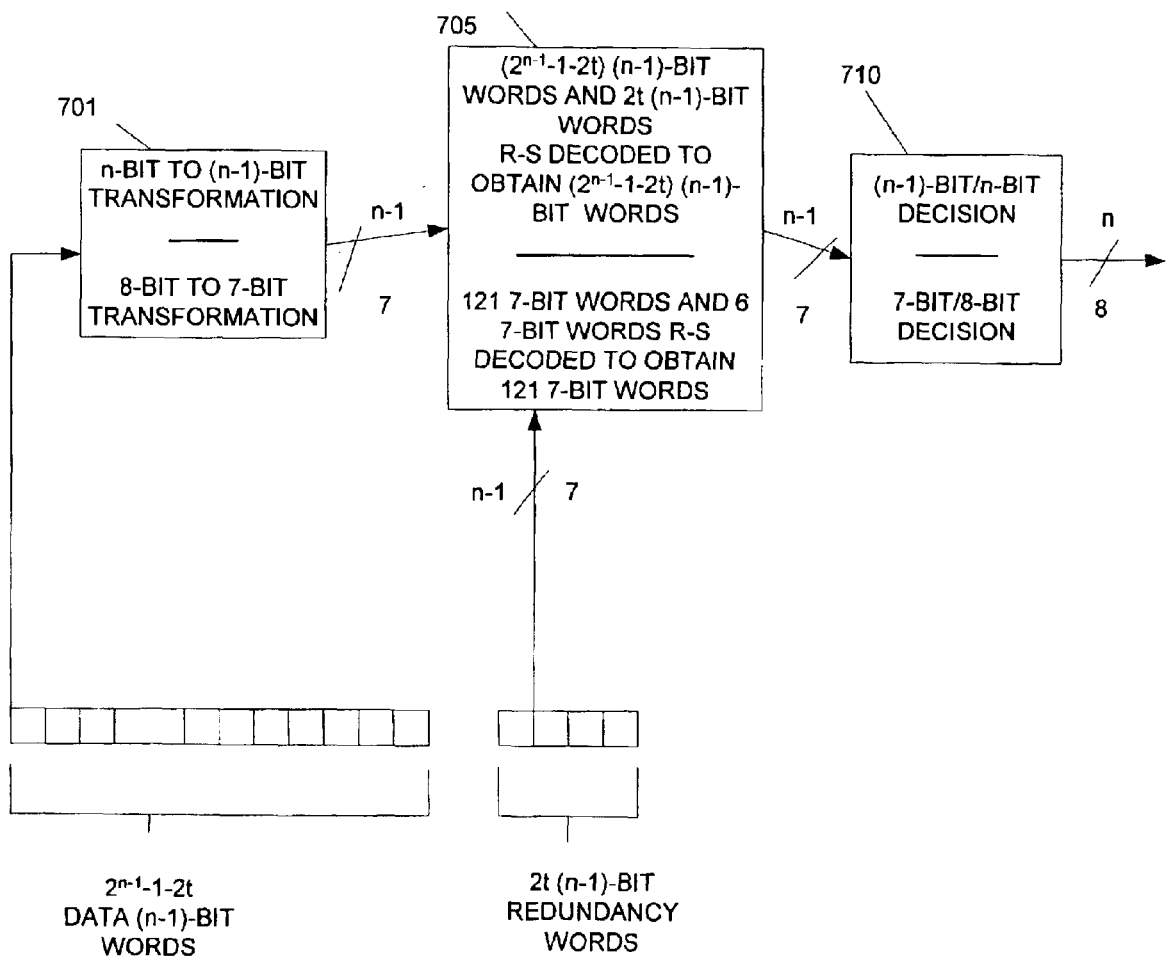
FIG. 7 is a flowchart illustrating low complexity modified R-S decoder transformation process 205 of FIG. 2, in accordance with an embodiment of the present invention.

FIG. 7 is a flowchart illustrating modified R-S decoder transformation process 205 of FIG. 2, in accordance with an embodiment of the present invention. In step 701, the $(2^{(n-1)}-1-2t)$ n-bit words are transformed into $(2^{(n-1)}-1-2t)$ (n−1)-bit words. In step 705, the $(2^{n-1}-1-2t)$ (n−1)-bit words and the 2t (n−1)-bit redundancy words are input into an R-S decoder. Thus, for example, the 121 8-bit words are transformed into 121 7-bit words and the 121 7-bit words and the 6 7-bit words are input into the R-S decoder. In step 710, a (n−1)-bit to n-bit decision occurs. Thus, in our example, a 7-bit to 8-bit decision occurs.

Figure 8:
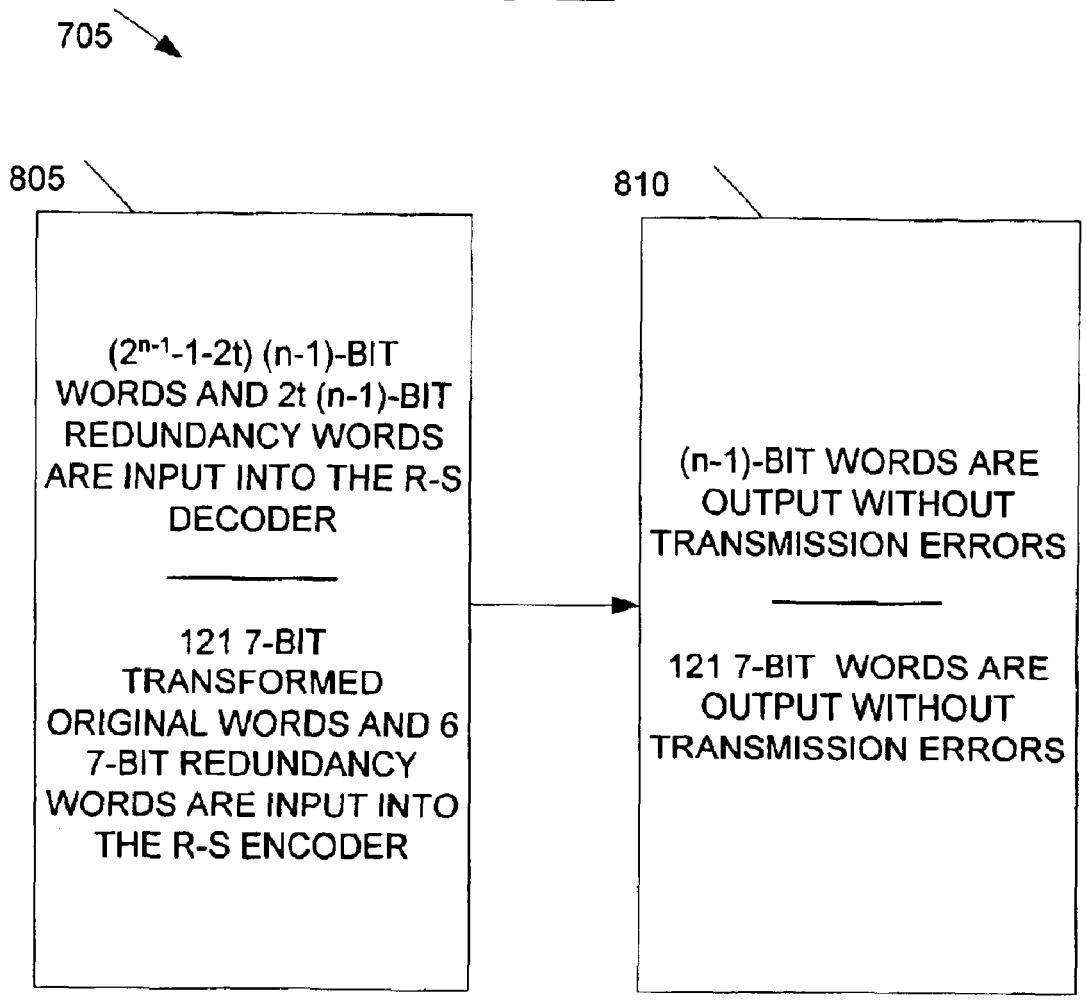
FIG. 8 is a flowchart illustrating R-S decoder process 705 of FIG. 7, in accordance with an embodiment of the present invention.

FIG. 8 is a flowchart illustrating R-S decoder process 705, in accordance with an embodiment of the present invention. The following example illustrates one embodiment of an R-S encoder. Those skilled in the relevant arts will be familiar with the R-S encoder, and will realize that other embodiments are possible.

In step 805, the $(2^{n-1}-1-2t)$ (n−1)-bit words and the 2t (n−1)-bit redundancy words are inputted into the R-S decoder. Thus, for example, the 121 7-bit words and the 6 7-bit redundancy words are input into the R-S decoder. In step 810, the R-S decoder uses the (n−1)-bit words and redundancy words to determine the (n−1)-bit word originally transmitted, making allowances for errors and corrections. Thus, for example, the R-S decoder uses the 121 7-bit words and the 6 7-bit redundancy words that the receiver received to determine the 121 7-bit words originally transmitted.

Figure 9:
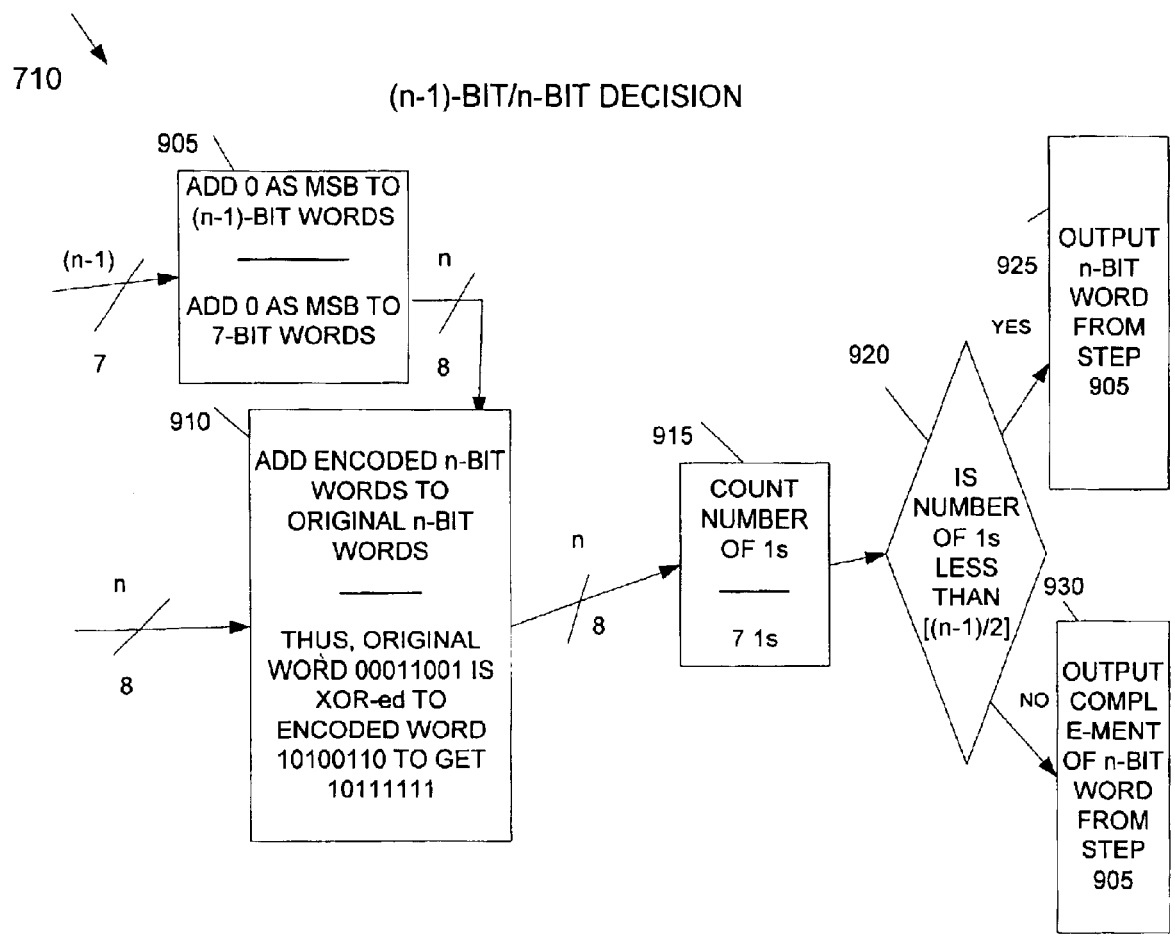

FIGS. 9–10 are a flowchart and a table illustrating the (n−1)-bit to n-bit decision process 710 of FIG. 7, in accordance with an embodiment of the present invention. In step 905, the $(2^{n-1}-1-2t)$ (n−1)-bit words each have 0 added as the MSB, and thus become n-bit words again. Thus, for example, the 121 7-bit words each have 0 added as the MSB to again become 8-bit words. In step 910, the $(2^{n-1}-1-2t)$ n-bit decoded words are bitwise exclusive OR-ed (XOR-ed) to the $(2^{n-1}-1-2t)$ n-bit received words to obtain an intermediary n-bit word. Thus, for example, in step 810, the 121 8-bit decoded words are bitwise XOR-ed to the 121 8-bit received words to obtain intermediary 8-bit words. That is, 00011001 would be bitwise XOR-ed to 10100110, resulting in 10111111. In step 915, the intermediary n-bit words are scrutinized to determine how many 1s are present. Thus, in the example, the intermediary word 10111111 has 7 1s. In step 920, it is determined if the number of 1s in the intermediary word is less than $\lceil(n-1)/2\rceil$ (i.e., the closest integer which is higher than (n−1)/2). If yes, in step 925, the received n-bit word is output. If no, the complement of the received n-bit word is output in step 930. Thus, in the example, there are 7 1s, which is not less than $\lceil(8-1)/2\rceil=\lceil7/2\rceil=4$, and the complement of 10111111, or 01000000 is output.

FIG. 10 illustrates additional examples of process 900.

Feed-Back Block Concatenated Code

Overview Process

Figure 11:
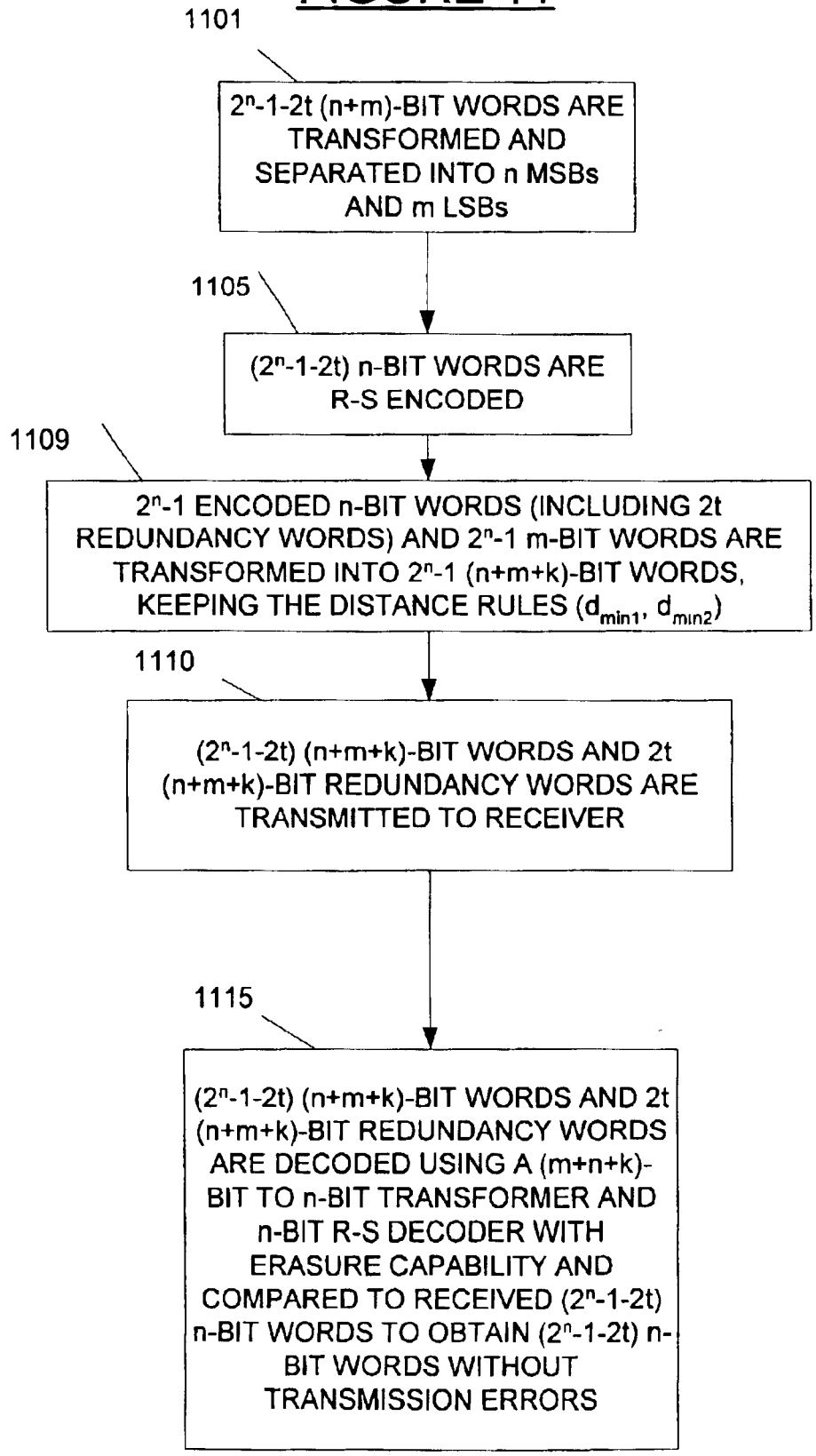
FIG. 11 illustrates an overview of the feed-back block concatenated code process 1100, according to an embodiment of the present invention.

FIG. 11 is a flowchart illustrating an overview of the feed-back block concatenated code process 1100, according to an embodiment of the present invention.

The feed-back block concatenated coding process 1100 encodes a block of $(2^{n-1}-1-2t)$ (n+m)-bit data words into a block of $(2^n-1)$ (n+m+k)-bit words using a n-bit RS encoder, transmits the words, and decodes the words into the original n-bit words.

Code design involves building a certain number of code words, which are divided into $2^n$ (e.g., $2^8=256$) groups with $2^m$ group member words each. For example, in the case of n=8, m=1, and k=1, the group number is defined as "$n_0 n_1 n_2 n_3 n_4 n_5 n_6 n_7$" with group member 1 as "$0 n_0 n_1 n_2 n_3 n_4 n_5 n_6 n_7 p$" and group member 2 as "$1 n_0 n_1 n_2 n_3 n_4 n_5 n_6 n_7 p$" where $n_i$ is bit number i of the n-bit word, and p is the even parity. For example, in one embodiment, group member 1 is a 10-bit number consisting of the group number bits, with 0 from the left and even parity (p) from the right. Group member 2 is a 10-bit number consistent of the complementary of the group number bits, with 1 from the left and even parity (p) from the right.

In step 1101, $(2^n-1-2t)$ (n+m)-bit words are transformed and separated into n MSBs and m LSBs. In step 1105, the $(2^n-1-2t)$ (n)-bit words are encoded using a modified R-S encoder to obtain $(2^n-1-2t)$ (n+m+k)-bit words and 2t (n+m+k)-bit redundancy words. In this embodiment, (n+m) is the number of bits of the original word, and m is a one bit input indicating if the parallel n-bit word is a data word or a special code word. The encoding incorporates an error-correcting capability utilized when interpreting the transmitted words. Thus, for example, in step 1105, if n=8, m=1, k=1, and t=8, the 239 9-bit words are encoded using a modified R-S encoder to obtain 239 10-bit words and 16 10-bit redundancy words. In step 1109, the $2^n-1$ encoded n-bit words (including the 2t redundancy words) and the $(2^n-1)$ m-bit words are transformed into $(2^n-1)$ (n+m+k)-bit words, keeping the distances rules ($d_{min1}$, $d_{min2}$). (For the 2t n-bit redundancy, the m-bit can be assumed to be 0,0 . . . 0 or any other sequence known to the transmitter and receiver. This known sequence does not need to be transmitted.) In step 1110, the $(2^n-1-2t)$ (n+m+k)-bit words and the 2t (n+m+k)-bit redundancy words are transmitted to the receiver. Thus, for example, the 239 10-bit words and the 16 10-bit redundancy words are transmitted to the receiver. The 239 10-bit words and the 16 10-bit redundancy words can be received erroneously. The decoding process 1115 will correct erroneous data. In step 1115, the received ($2^n-1-2t$) (n+m+k)-bit words and the 2t (n+m+k)-bit redundancy words are decoded using a modified R-S decoder, and compared to the received (n+m+k)-bit words to obtain ($2^n-1-2t$) (n+m)-bit words. The decoding process 1115 utilizes the error-correcting capability built in during encoding process 1105. Thus, for example, the data corresponding to the 239 10-bit words and the 16 10-bit redundancy words are decoded to obtain 239 9-bit words that correspond to the original 239 9-bit words, even if there were errors in the transmission.

Encoder

Figure 12:
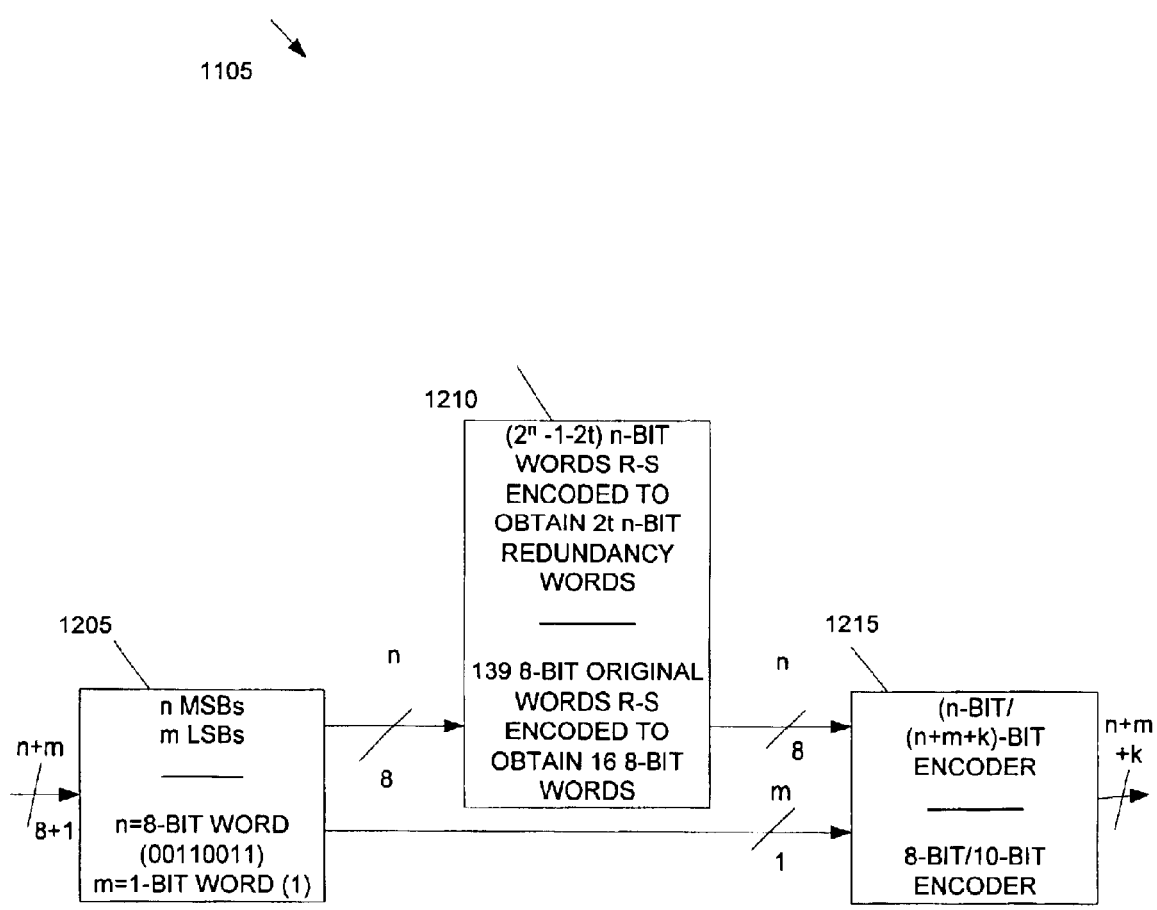
FIG. 12 is a flowchart illustrating feed-back block concatenated encoder process 1105, in accordance with an embodiment of the present invention.

FIG. 12 is a flowchart illustrating feed-back block concatenated encoder process 1105, in accordance with an embodiment of the present invention.

In step 1205, a stream of (n+m)-bit words is input into a look up table (LUT), and divided into n-bit words and an m-bit word. As the data words are made up of some combination of 0s and 1s, there are $2^{n+m}$ possibilities for input data words. The n bits are the most significant bits (MSBs), which are the highest-order (leftmost) digits of a binary number. The m bits are the least significant bits (LSBs), which are the low-order (rightmost) digits of a binary number. Thus, for example, if 001100111 is input as the (n+m)-bit word, it is divided into an n-bit word of 00110011 and an m-bit word of 1. It should be noted that $2^m$ different n-bit words can be input into process 1205 to yield the same n-bit output word.

In step 1210, the ($2^n-1-2t$) n-bit words are input into a Reed-Solomon encoder to obtain 2t redundancy words. Thus, in the example, 239 8-bit words are input into the R-S encoder to obtain 16 8-bit redundancy words.

It should be noted that for purposes of explanation, it is assumed that a ($n_1, n_1-2t$) Reed-Solomon code is used, with n-bit words, where $n_1$ can be any number less than or equal to ($2^n-1$), where t is the error correction capability of the Reed-Solomon code, which gives 2t redundancy words. Those skilled in the relevant arts will recognize that a R-S encoder can also be used on words of other bit length.

In step 1215, the ($2^n-1-2t$) n-bit words and the 2t redundancy words are combined with the m-bit word and input into a (n+m)-bit to (n+m+k)-bit encoder, where k bits are added as a redundancy to the (n+m)-bit data words, to generate an encoded word with (n+m+k)-bits. The output of the decoder is a (n+m+k)-bit word. Thus, for example, the 239 9-bit words are transformed into 239 10-bit words and 16 10-bit redundancy words.

It should be noted that the (n+m)-bit to (n+m+k)-bit encoder is designed so the minimum Hamming distance (the number of bit places) between 2 code words is at least $d_{min1}$. In addition, the (n+m)-bit to (n+m+k)-bit encoder divides the code words into $2^n$ groups of $2^m$ words, and each group has a minimum Hamming distance of $d_{min2}$.

Decoder

Figure 13:
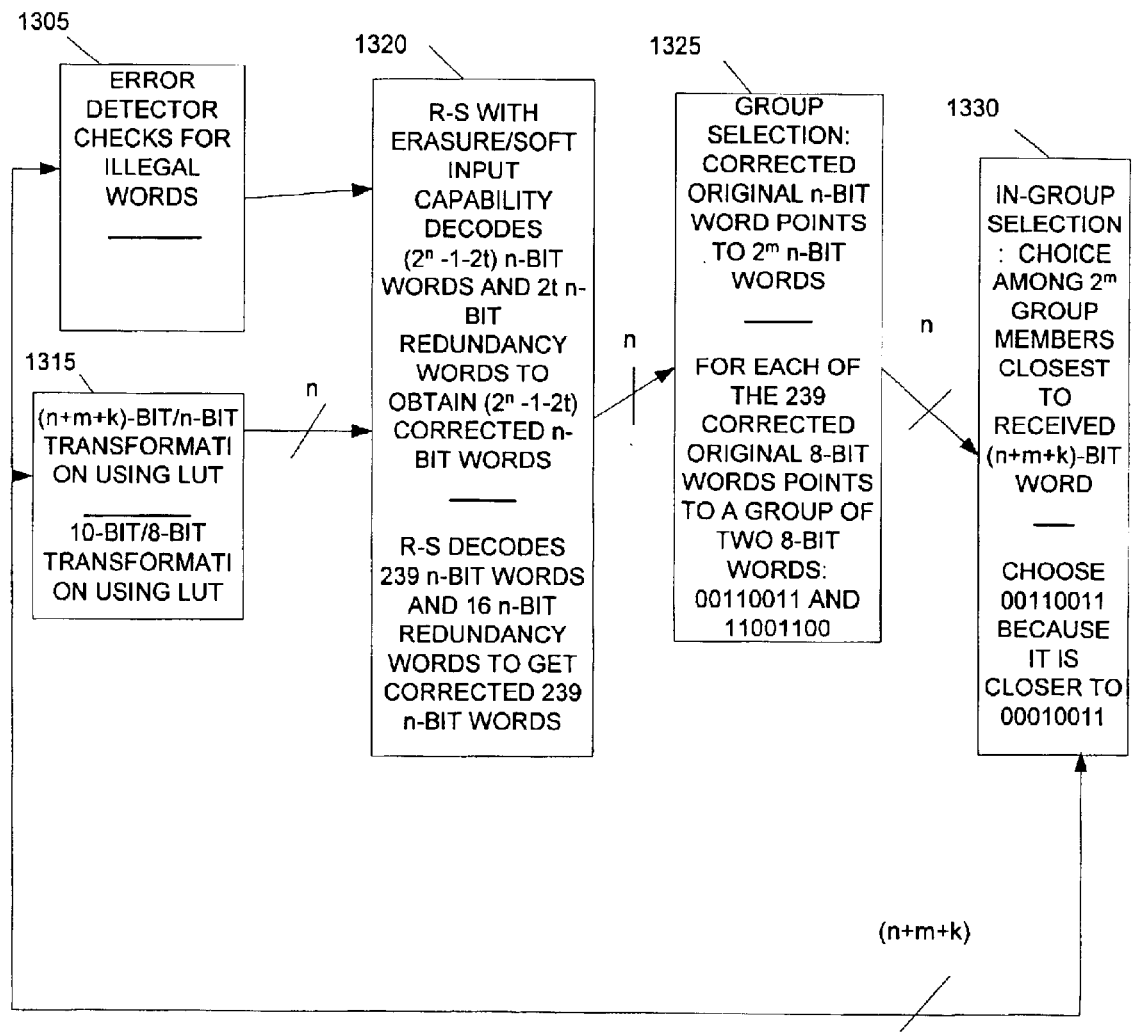
FIG. 13 is a flowchart illustrating feed-back block concatenated code decoder process 1115, according to an embodiment of the present invention.

FIG. 13 is a flowchart illustrating the feed-back block concatenated code decoder process 1115.

In step 1305, the transmitted (n+m+k)-bit words and the (n+m+k)-bit redundancy words are input into the feed-back block concatenated decoder, where an error detector determines if any received words are illegal words (e.g., undefined words). If the received word is illegal, it is erased. As explained in the background, these transmitted words can have errors due to transmission noise.

In step 1315, the (n+m+k)-bit words are transformed into n-bit words using a look up table ("LUT"). Thus, for example the 10-bit words are transformed into 8-bit words. It would be noted that $2^{(m+k)}$ (n+m+k)-bit words generate the same (n+m+k)-bit word.

In step 1320, the n-bit words from process 1515 and the output of the error detection process 1505 (as side information) are input into the R-S decoder. Reed-Solomon decoders, which use this side information, are well known and achieve higher gain than Reed-Solomon decoders with no side information.

In step 1325, a group selection is completed. In this step, the n-bit output of the Reed-Solomon decoder indicates a group selection (one of $2^n$ groups, each with $2^m$ members) for words corresponding to the original transmitted data. Thus, for example, for each of the 239 corrected 8-bit words points to a group of 2 corresponding 8-bit words, such as 00110011 and 11001100.

In step 1330, an in-group selection is completed. In this step, the group member within the group with the minimum Hamming distance to the received (n+m+k)-bit word is chosen. Thus, in the example, if the transmitted original uncoded word was 00010011, then 00110011 would be selected because it is closer to the transmitted original uncoded word than 11001100.

Ethernet Feed-Back Block Concatenated Coding

In an alternative embodiment of the present invention, a feed-back block concatenated code is designed for Ethernet Point to Multi-Point (P2MP) Physical Layer ("Ethernet"). In the case of the Ethernet, the coding scheme is designed to achieve high transition density, direct current (DC), balance, and special code groups above the ability of a normal error correction code.

In this embodiment, 8-bit data words ($2^8$ or 256 possibilities) and 12 special code groups are transmitted. Therefore, only 268 10-bit code words out of $2^9$ (or 256) are needed. These are chosen to be words with special properties (e.g., words with a limited number of 1s and 0s, and words with a minimum number of transitions). For example, only words with 4 and 6 1s and with at least 4 transitions are chosen. This yields 170 groups of 2 members, or 340 words, of which 256 words are used for data and 84 used as special code groups (only 12 of them are required by the Ethernet).

Conclusion

The present invention is described in terms of the above embodiments. This is for convenience only and is not intended to limit the application of the present invention. In fact, after reading the description of the present invention, it will be apparent to one skilled in the relevant arts how to implement the present invention in alternative embodiments.

In addition, it should be understood that FIGS. 1–13 described above, which highlight the functionality and advantages of the present invention, are presented for example purposes only. The architecture of the present invention is sufficiently flexible and configurable, such that it may be utilized in ways other than that shown in FIGS. 1–13.

What is claimed is:

1. A method of transmitting original ($2^{(n-1)}-1-2t$) n-bit data words in a network, in order to provide an error-correcting capability of t number of bytes, comprising:

transforming the ($2^{(n-1)}-1-2t$) n-bit words into ($2^{(n-1)}-1-2t$) (n−1)-bit words;

encoding the ($2^{(n-1)}-1-2t$) (n−1)-bit words with a Reed-Solomon encoder to create 2t (n−1)-bit redundancy words; and transmitting the 2t (n−1)-bit redundancy words and the original ($2^{(n-1)}-1-2t$) n-bit data words to a destination, thereby allowing for decoding.

2. The method of claim 1, wherein the decoding comprises:

transforming the decoded ($2^{(n-1)}-1-2t$) n-bit words into decoded ($2^{(n-1)}-1-2t$) (n−1)-bit words;

decoding the $(2^{(n-1)}-1-2t)$ (n−1)-bit words and the 2t (n−1)-bit redundancy words with a shortened Reed-Solomon decoder to obtain decoded $(2^{(n-1)}-1-2t)$ (n−1)-bit decoded words;

transforming the $(2^{(n-1)}-1-2t)$ (n−1)-bit decoded words into $(2^{(n-1)}-1-2t)$ n-bit transformed decoded words by a predefined code definition; and comparing the transformed decoded $(2^{(n-1)}-1-2t)$ n-bit words to the received $(2^{(n-1)}-1-2t)$ n-bit words to obtain the original $(2^{(n-1)}-1-2t)$ n-bit words without transmission errors.

3. The method of claim 2, wherein transforming the $(2^{(n-1)}-1-2t)$ (n−1)-bit words into $(2^{(n-1)}-1-2t)$ n-bit words comprises:

adding 0 as a most significant bit (MSB) to each decoded (n−1)-bit word to obtain a transformed decoded n-bit word.

4. The method of claim 2, wherein comparing the transformed decoded $(2^{(n-1)}-1-2t)$ n-bit words to the received $(2^{(n-1)}-1-2t)$ n-bit words to obtain the estimated $(2^{(n-)}-1-2t)$ n-bit words without transmission errors comprises:

XOR-ing the transformed decoded $(2^{(n-1)}-1-2t)$ n-bit words to the received $(2^{(n-1)}-1-2t)$ n-bit words to obtain intermediary $(2^{(n-1)}-1-2t)$ n-bit words;

determining whether the number of 1s in the intermediary $(2^{(n-)}-1-2t)$ n-bit words is less than $\lceil (n-1)/2 \rceil$;

outputting the decoded n-bit word when the determination is positive; and outputting the complementary of the decoded n-bit word when the determination is negative.

5. A method of transmitting original (L−1−2t) n-bit data words in a network, in order to provide an error-correcting capability of t number of bytes, wherein $0<L<2^{(n-1)}$, comprising:

transforming the (L−1−2t) n-bit words into (L−1−2t) (n−1)-bit words;

encoding the (L−1−2t) (n−1)-bit words with a Reed-Solomon encoder to create 2t (n−1)-bit redundancy words; and transmitting the 2t (n−1)-bit redundancy words and the original (L−1−2t) n-bit data words to a destination, thereby allowing for decoding.

6. A method of transmitting original $(2^n-1-2t)$ (m+n)-bit data words, with an error-correcting capability of t words, comprising:

transforming the $(2^n-1-2t)$ (n+m)-bit words into $(2^n-1-2t)$ pairs of n-bit words and m-bit words;

encoding the $(2^n-1-2t)$ n-bit words with a shortened Reed-Solomon encoder to obtain 2t n-bit redundancy words; and encoding the $(2^n-1-2t)$ n-bit words and the 2t n-bit redundancy words to obtain $(2^n-1-2t)(n+m+k)$-bit words and 2t (n+m+k)-bit redundancy words such that each n-bit word is connected to $2^m$ group members, thereby allowing for decoding.

7. The method of claim 6, wherein the decoding comprises:

detecting and signing illegal words from the $(2^n-1-2t)$ (n+m+k)-bit words and the 2t (n+m+k)-bit redundancy words;

erasure decoding the $(2^n-1-2t)$ n-bit words and the 2t n-bit redundancy words with a Reed-Solomon decoder using the signed words to obtain decoded $(2^{n-1-2}t)$ n-bit words; and finding among the $2^m$ group members the (m+n+k)-bit word which has the minimum hamming distance to the received (m+n+k) word.

8. The method of claim 7, wherein word limitations exist comprising at least one of a group consisting of:

an allowed number of 1s and 0s in the words; and a required minimum number of transitions in the words.

9. A method of transmitting original (L−1−2t) (m+n)-bit data words, wherein $0<1<2^n$, with an error-correcting capability of t words, comprising:

transforming the (L−1−2t) (n+m)-bit words into (L−1−2t) pairs of n-bit words and m-bit words;

encoding the (L−1−2t) n-bit words with a shortened Reed-Solomon encoder to obtain 2t n-bit redundancy words; and encoding the (L−1−2t) n-bit words and the 2t n-bit redundancy words to obtain (L−1−2t)(n+m+k)-bit words and 2t (n+m+k)-bit redundancy words such that each n-bit word is connected to $2^m$ group members, thereby allowing for decoding.

10. A computer program product comprising a computer usable medium having control logic stored therein for causing a computer to transmit original $(2^{(n-1)}-1-2t)$ n-bit data words, with an error-correcting capability of t number of bytes, comprising encode transmission words, comprising:

first computer readable program code means for transforming the $(2^{(n-1)}-1-2t)$ n-bit words into $(2^{(n-1)}-1-2t)$ (n−1)-bit words;

second computer readable program code means for encoding the $(2^{(n-1)}-1-2t)$ (n−1)-bit words with a Reed-Solomon encoder to create 2t (n−1)-bit redundancy words;

third computer readable program code means for transmitting the 2t (n−1)-bit redundancy words and the original $(2^{(n-1)}-1-2t)$ n-bit data words to a destination;

fourth computer readable program code means for transforming the $(2^{(n-1)}-1-2t)$ n-bit words into $(2^{(n-1)}-1-2t)$ (n−1)-bit words;

fifth computer readable program code means for decoding the $(2^{(n-1)}-1-2t)$ (n−1)-bit words and the 2t (n−1)-bit redundancy words with a Reed-Solomon decoder to obtain decoded $(2^{(n-1)}-1-2t)$ (n−1)-bit words;

sixth computer readable program code means for transforming the decoded $(2^{(n-1)}-1-2t)$ (n−1)-bit words into transformed decoded $(2^{(n-1)}-1-2t)$ n-bit words; and seventh computer readable program code means for comparing the transformed decoded $(2^{(n-1)}-1-2t)$ n-bit words to the received $(2^{(n-1)}-1-2t)$ n-bit words to obtain the estimated $(2^{(n-1)}-1-2t)$ n-bit words without transmission errors.

11. The computer program product of claim 10, wherein the sixth computer readable program code means comprises:

adding 0 as a most significant bit (MSB) to each (n−1)-bit non-transformed word to obtain a n-bit transformed word.

12. The computer program product of claim 11, wherein the seventh computer readable program code means comprises:

XOR-ing the transformed decoded $(2^{(n-1)}-1-2t)$ n-bit words to the received $(2^{(n-1)}-1-2t)$ n-bit words to obtain intermediary $(2^{(n-1)}-1-2t)$ n-bit words;

determining if the number of 1s in the intermediary $(2^{(n-)}-1-2t)$ n-bit words is less than $\lceil (n-1)/2 \rceil$;

outputting the transformed n-bit word when the number of 1s in the intermediary n-bit word is less than $\lceil (n-1)/2 \rceil$; and outputting the complement of the transformed decoded n-bit word when the number of 1s in the intermediary word is not less than $\lceil(n-1)/2\rceil$.

13. A computer program product comprising a computer usable medium having control logic stored therein for causing a computer to transmit original $(2^n-1-2t)$ $(n+m)$-bit data words, with an error-correcting capability of t number of bytes, comprising:

first computer readable program code means for causing the computer to transform the $(2^n-1-2t)$ $(n+m)$-bit words into $(2^n-1-2t)$ $(n+m)$-bit words;

second computer readable program code means for dividing the $(2^n-1-2t)$ $(n+m)$-bit words into $(2^n-1-2t)$ n-bit words and $(2^n-1-2t)$ m-bit words;

third computer readable program code means for encoding the $(2^n-1-2t)$ $(m+n)$-bit words with a Reed-Solomon encoder to obtain 2t n-bit redundancy words;

fourth computer readable program code means for encoding the $(2^n-1-2t)$ n-bit words and the 2t n-bit redundancy words to obtain $(2^n-1-2t)(n+m+k)$-bit words and 2t $(n+m+k)$-bit redundancy words;

fifth computer readable program code means for transmitting the $(2^n-1-2t)(n+m+k)$-bit words and the 2t $(n+m+k)$-bit redundancy words;

sixth computer readable program code means for checking and signing the $(2^n-1-2t)(n+m+k)$-bit words and the 2t $(n+m+k)$-bit redundancy words for illegal words;

seventh computer readable program code means for transforming the $(2^n-1-2t)$ $(n+m+k)$-bit words into n-bit words;

eighth computer readable program code means for decoding the $(2^n-1-2t)$ n-bit words and the 2t n-bit redundancy words with a Reed-Solomon decoder to obtain decoded $(2^n-1-2t)$ n-bit words; and ninth computer readable program code means for choosing group member words from the $2^m$ groups that have the smallest hamming distance to the receive $(n+m+k)$-bit received words to obtain the original $(2^n-1-2t)$ n-bit words without transmission errors.

14. The computer program product of claim 13, wherein word limitations exist comprising at least one of a group consisting of:

an allowed number of 1s and 0s in the words; and a required minimum number of transitions in the words.

* * * * *